(12) United States Patent
Schubert et al.

(10) Patent No.: US 9,577,058 B2
(45) Date of Patent: Feb. 21, 2017

(54) DEVICES, SYSTEMS, AND METHODS RELATED TO REMOVING PARASITIC CONDUCTION IN SEMICONDUCTOR DEVICES

(71) Applicant: Micron Technology, Inc., Boise, ID (US)

(72) Inventors: Martin F. Schubert, Boise, ID (US); Vladimir Odnoblyudov, Eagle, ID (US); Cem Basceri, Los Gatos, CA (US); Thomas Gehrke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/796,974

(22) Filed: Jul. 10, 2015

(65) Prior Publication Data
US 2015/0318388 A1  Nov. 5, 2015

Related U.S. Application Data

(62) Division of application No. 13/646,307, filed on Oct. 5, 2012, now Pat. No. 9,082,748.

(51) Int. Cl.
*H01L 29/15* (2006.01)
*H01L 29/423* (2006.01)
(Continued)

(52) U.S. Cl.
CPC ..... *H01L 29/42316* (2013.01); *H01L 29/0603* (2013.01); *H01L 29/205* (2013.01);
(Continued)

(58) Field of Classification Search
CPC ............. H01L 29/7787; H01L 29/0603; H01L 29/2003; H01L 29/205; H01L 29/4175; H01L 29/42316; H01L 29/7786
See application file for complete search history.

(56) References Cited

U.S. PATENT DOCUMENTS

| | | |
|---|---|---|
| 2006/0006554 A1 | 1/2006 | Yoo et al. |
| 2009/0001478 A1 | 1/2009 | Okamoto |
| | (Continued) | |

FOREIGN PATENT DOCUMENTS

| | | |
|---|---|---|
| CN | 102255012 | 11/2011 |
| EP | 2428995 A2 | 3/2012 |
| | (Continued) | |

OTHER PUBLICATIONS

Chung, J.W. et al., GaN-on-Si Technology, "A New Approach for Advanced Devices in Energy and Communications, Proceedings of the 2010 European Solid-State Device Research Conference (ESSDERC)," Sep. 14-16, 2010, pp. 52-56.
(Continued)

*Primary Examiner* — John C Ingham
*Assistant Examiner* — Frederick B Hargrove
(74) *Attorney, Agent, or Firm* — Perkins Coie LLP

(57) ABSTRACT

Semiconductor devices and methods for making semiconductor devices are disclosed herein. A method configured in accordance with a particular embodiment includes forming a stack of semiconductor materials from an epitaxial substrate, where the stack of semiconductor materials defines a heterojunction, and where the stack of semiconductor materials and the epitaxial substrate further define a bulk region that includes a portion of the semiconductor stack adjacent the epitaxial substrate. The method further includes attaching the stack of semiconductor materials to a carrier, where the carrier is configured to provide a signal path to the heterojunction. The method also includes exposing the bulk region by removing the epitaxial substrate.

17 Claims, 6 Drawing Sheets

(51) Int. Cl.
*H01L 29/205* (2006.01)
*H01L 29/06* (2006.01)
*H01L 29/778* (2006.01)
*H01L 29/20* (2006.01)
*H01L 29/417* (2006.01)

(52) U.S. Cl.
CPC ...... *H01L 29/7786* (2013.01); *H01L 29/7787* (2013.01); *H01L 29/2003* (2013.01); *H01L 29/4175* (2013.01); *H01L 2224/16227* (2013.01)

(56) References Cited

U.S. PATENT DOCUMENTS

| | | |
|---|---|---|
| 2009/0096023 A1 | 4/2009 | Cho |
| 2009/0134405 A1 | 5/2009 | Ota et al. |
| 2010/0140797 A1 | 6/2010 | Yanase |
| 2010/0295100 A1* | 11/2010 | Huang ................ H01L 29/2003 257/256 |
| 2011/0140172 A1 | 6/2011 | Chu et al. |
| 2011/0272708 A1* | 11/2011 | Yoshioka .......... H01L 21/28264 257/77 |
| 2012/0061727 A1* | 3/2012 | Lee .................... H01L 29/2003 257/183 |
| 2012/0193677 A1 | 8/2012 | Parikh et al. |
| 2012/0314371 A1* | 12/2012 | Mishra ................ H01L 21/8252 361/709 |
| 2014/0097441 A1 | 4/2014 | Schubert et al. |

FOREIGN PATENT DOCUMENTS

| | | |
|---|---|---|
| JP | 62134965 | 6/1987 |
| JP | 2009513014 A | 3/2009 |
| JP | 2010103235 A | 5/2010 |
| KR | 20120027987 A | 3/2012 |

OTHER PUBLICATIONS

International Search Report and Written Opinion issued Jan. 8, 2014 in International Application No. PCT/US2013/061196, 10 pages.
Kim, C. et al., "Buffer Layer Strain in Transfer in AlN/GaN Near Critical Thickness, Journal of Applied Physics," vol. 85, No. 8, pp. 4040-4044. Apr. 15, 1999.
Extended European Search Report mailed Jun. 17, 2016 in European Application No. 13843408.9, 10 pages.
Office Action mailed Jun. 26, 2015 in Taiwan Application No. 102134361, 17 pages.
Office Action mailed Jun. 7, 2016 in Japan Application No. 2015-535692, 8 pages.
Office Action mailed Jul. 28, 2016 in Korean Application No. 10-2015-7010935, 12 pages.

* cited by examiner

DEVICES, SYSTEMS, AND METHODS RELATED TO REMOVING PARASITIC CONDUCTION IN SEMICONDUCTOR DEVICES

CROSS-REFERENCE TO RELATED APPLICATION

This application is a divisional of U.S. application Ser. No. 13/646,307 filed Oct. 5, 2012, now U.S. Pat. No. 9,082,748, which is incorporated herein by reference in its entirety.

TECHNICAL FIELD

The present technology is related to semiconductor devices employed in high-power, high-voltage applications. In particular, some embodiments of the present technology are related to field effect transistor devices that employ heterojunctions, such as high electron mobility transistors.

BACKGROUND

High electron mobility transistors (HEMTs) employ a heterojunction defined by semiconductor materials having different bandgap energy levels. A gate provides an applied electric field to the heterojunction, which causes a conductive channel to be formed between the source and drain of the HEMT. Another electrical field applied across the source and drain causes an electrical current to flow through the conductive channel. When the applied field of the gate is removed, the electrical current between the source and drain will cease flowing, even when the applied field between the source and drain is not removed.

High voltage HEMTs are used in applications where the applied voltages are much higher than portable semiconductor devices. These transistors are employed in a variety of devices and applications, including power supplies, electric cars, solar cells, and large solid state transistors, to name a few. The breakdown voltage of a high voltage device is proportional to the amount of parasitic electrical current that leaks away from the current flowing between the source and the drain. When a voltage larger than the breakdown voltage is applied, parasitic current will flow regardless of whether there is an applied field provided by the gate (i.e., when the device is in an off state). This parasitic current limits device performance, including the maximum operational voltage.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Specific details of several embodiments of methods for making semiconductor devices are described herein along with related methods, devices, and systems. The term "semiconductor device" generally refers to a solid-state device that includes semiconductor material. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a wafer-level substrate or to a singulated, die-level substrate. A person having ordinary skill in the relevant art will recognize that suitable steps of the methods described herein can be performed at the wafer-level or at the die-level. Furthermore, unless the context indicates otherwise, structures disclosed herein can be formed using conventional semiconductor-manufacturing techniques. Materials can be removed, for example, using plasma etching, wet etching, chemical-mechanical planarization, or other suitable techniques. Similarly, materials can be deposited, for example, using chemical vapor deposition, physical vapor deposition, atomic material deposition, spin coating, and/or other suitable techniques. The terms "epitaxy" and "epitaxial" refer to deposition techniques involving crystalline semiconductor materials that cause the semiconductor materials to be in registry with one another. For example, an epitaxial semiconductor material can be grown or otherwise deposited on an epitaxial substrate of a different semiconductor material and exhibit a crystalline order similar to that substrate.

Many embodiments of the present technology are described below in the context of heterojunctions, such as those semiconductor devices that are formed to have adjacent regions of semiconductor materials with different band gap energy levels. A person having ordinary skill in the relevant art will also recognize that the present technology may have additional embodiments, such as multiple heterojunctions (e.g., heterostructures) and/or graded heterojunctions, and that the present technology may be practiced without several of the details of the embodiments described herein with reference to FIGS. 1-12. For ease of reference, throughout this disclosure identical reference numbers are used to identify similar or analogous components or features, but the use of the same reference number does not imply that the parts should be construed to be identical. Indeed, in many examples described herein, the identically-numbered parts are distinct in structure and/or function. Furthermore, the same shading may be used to indicate materials in a cross section that can be compositionally similar, but the use of the same shading does not imply that the materials should be construed to be identical.

Figure 1:
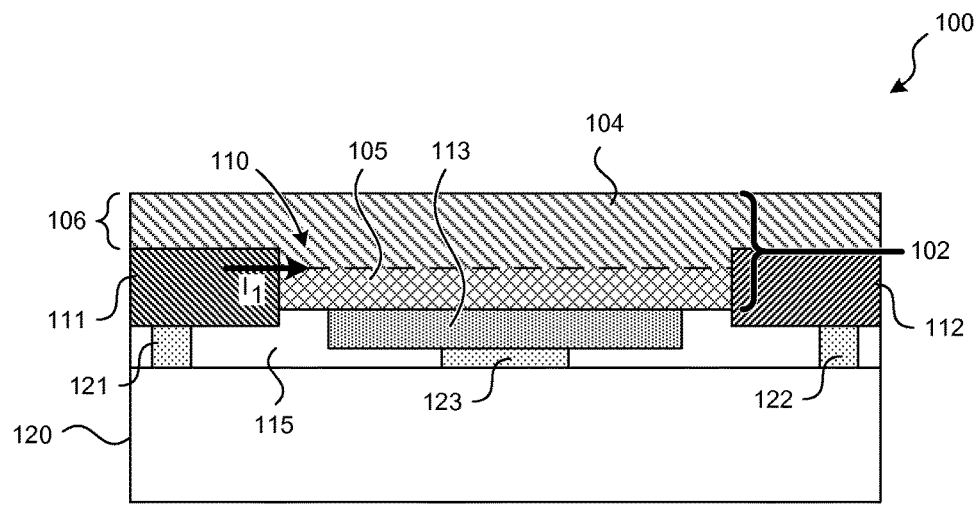
FIG. 1 is a partially schematic cross-sectional view illustrating a semiconductor device configured in accordance with an embodiment of the present technology.

FIG. 1 is a partially schematic cross-sectional side view of a semiconductor device 100 configured in accordance with an embodiment of the present technology for inhibiting parasitic conduction. The semiconductor device 100 includes a stack of epitaxial semiconductor material 102 having a first epitaxial semiconductor material 104 and a second epitaxial semiconductor material 105. The first and second semiconductor materials 104 and 105 include different or dissimilar semiconductor materials that define a heterojunction region 110. The first semiconductor material 104 also defines a bulk region 106 adjacent to the heterojunction region 110. In general, the bulk region 106 has a high resistance corresponding to the resistivity of the semiconductor material of the first semiconductor material 104.

Embodiments of the semiconductor device 100 employ a carrier 120 that is coupled to the first and second semiconductor materials 104 and 105 and configured for carrying the semiconductor materials. In particular, the carrier 120 is a substrate or structural material that is separate from an epitaxial substrate or material (not shown in FIG. 1) used to form the first and second semiconductor materials 104 and 105. The carrier 120 and the first and second semiconductor materials 104 and 105 are configured such that the bulk region 106 is separate and electrically isolated from the bulk of the epitaxial substrate. The isolation at least substantially eliminates parasitic conduction through the semiconductor device that would otherwise be a component of an electrical current $I_1$ through the semiconductor device 100. It also eliminates parasitic conduction that would occur when a voltage higher than the breakdown voltage is applied to the semiconductor device 100 when it is in an off state.

In FIG. 1, the carrier 120 is employed in a semiconductor device 100 that is configured as a transistor device having a gate region 113 and conductive regions 111 and 112. The gate region 113 and the conductive regions 111 and 112 can provide, respectively, a source, a drain, and a gate of the transistor device. Interconnects 121-123 can electrically couple the gate region 113 and the conductive regions 111 and 112 to the carrier 120 through a dielectric material 115. In one embodiment, the transistor device is a high voltage HEMT device that employs, for example, Gallium Nitride (GaN) as the first semiconductor material 104 and Aluminum Gallium Nitride (AlGaN) as the second semiconductor material 105 to form a GaN/AlGaN heterojunction region 110. In other embodiments, the first and second semiconductor materials 104 and 105 can include other III-V semiconductor materials or other compound semiconductor materials, such as II-VI semiconductor materials or other combinations of dissimilar semiconductor materials that form a heterojunction region 110. For example, Gallium Arsenide (GaAs) and Aluminum Gallium Arsenide (AlGaAs) can form a heterojunction region 110.

Conventional semiconductor devices, in contrast to the semiconductor device 100, typically retain the epitaxial substrate used to form a heterojunction. This epitaxial substrate, while useful for structurally supporting the device, creates additional parasitic conduction paths through its bulk region. In particular, these parasitic conduction paths extend through the much lower resistivity semiconductor material of the epitaxial substrate. As discussed above, parasitic conduction limits the breakdown voltage of semiconductor devices, including the breakdown voltages of high voltage devices. Previous techniques to reduce the parasitic conduction include selectively removing semiconductor material from the epitaxially grown semiconductor materials. For example, a conventional technique includes removing semiconductor material from below the channel region. While increasing breakdown voltage, removal of material from this region causes undesirable heating in the channel when the device is operated. Not only that, it also increases the complexity of manufacturing and reduces yield. For example, removing too much or too little material from below the channel region can alter threshold voltage and cause a device not to comport with manufacturing tolerances.

Methods and devices in accordance with embodiments of the present technology remove the material of the epitaxial substrate and employ the carrier 120 to overcome these and other limitations associated with conventional devices. In particular, parasitic conductance through the bulk of the epitaxial substrate is eliminated. This can allow higher breakdown voltages in the semiconductor devices. Further, device yields after manufacturing the semiconductor device are improved because material is not required to be removed from directly under the channel region of the device (e.g., between a heterojunction region and the bulk of an epitaxial semiconductor material used to form the heterojunction region). In some embodiments, the removed material from the epitaxial substrate exposes the first semiconductor material and allows for one or more electrodes to be electrically coupled through the first semiconductor material 104 to the heterojunction region 110 (described further with reference to FIGS. 9-11).

Figure 2:
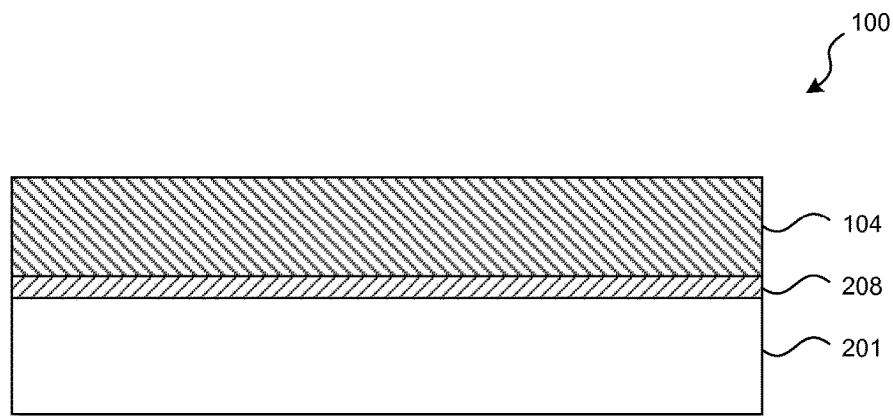
FIGS. 2-6 are partially schematic cross-sectional views illustrating a semiconductor device at selected steps in a method of manufacture in accordance with an embodiment of the present technology.

FIGS. 2-6 are partially schematic cross-sectional views illustrating a portion of the semiconductor device 100. As shown in FIG. 2, the semiconductor device 100 can include an epitaxial substrate 201 and the first semiconductor material 104 formed from the epitaxial substrate 201. For example, the epitaxial substrate 201 can provide a seed material for the epitaxial growth of the first semiconductor material 104. Embodiments of the epitaxial substrate 201 include silicon, sapphire, silicon carbide, silicon on poly-aluminum nitride, or another suitable substrate. As shown in FIG. 2, embodiments can have a buffer material 208 that separates the first semiconductor material 104 from the epitaxial substrate 201. The buffer material 208 can be an epitaxial material that provides lattice matching to the first semiconductor material 104. For example, if the first semiconductor material 104 is GaN, the buffer material 208 can be Aluminum Nitride (AlN) or other suitable material. In other embodiments, and depending on the material of the epitaxial substrate 201, the buffer material 208 may be omitted and the first semiconductor material 104 may be formed directly on the epitaxial substrate 201.

Figure 3:
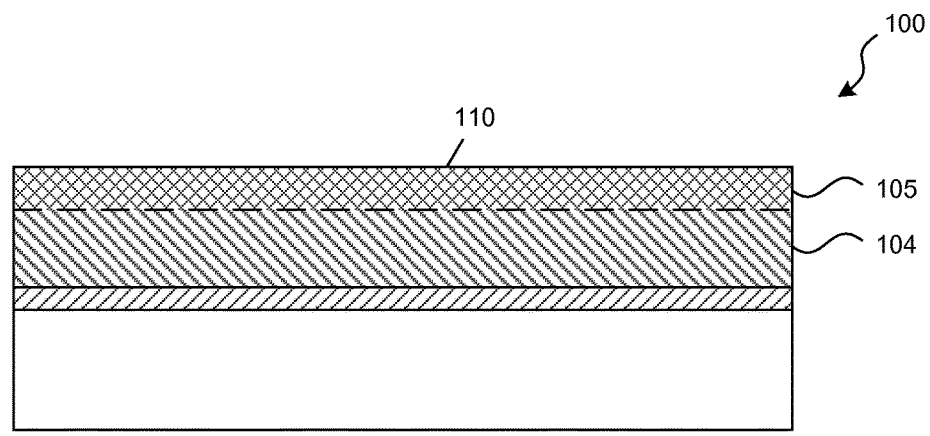

FIG. 3 shows the semiconductor device 100 after the second semiconductor material 105 has been formed. The first semiconductor material 104 can act as a seed material for epitaxially forming the second semiconductor material 105. The first and second semiconductor materials 104 and 105 together define the heterojunction region 110. The heterojunction region 110 is configured so that a channel (e.g., a two-dimensional electron gas channel) is formed when an electric field is applied to the heterojunction. In some embodiments, the heterojunction region 110 can be alloyed and/or doped with impurities, such as to provide gradation in the lattice constant in the heterojunction. In another embodiment, the heterojunction region 110 can include another epitaxial material formed between the first and second semiconductor materials 104 and 105.

Figure 4:
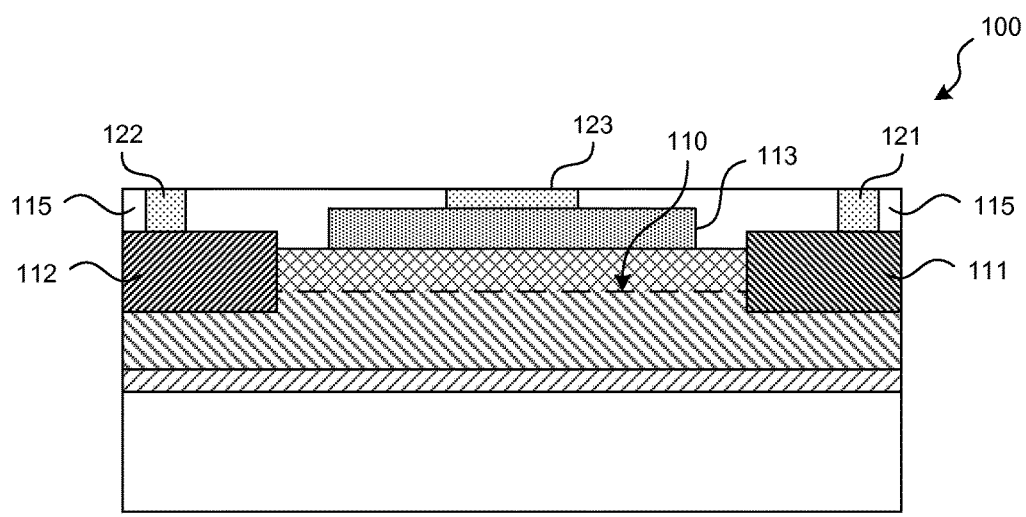

FIG. 4 shows the semiconductor device 100 after forming the conductive regions 111 and 112, the gate region 113, and the dielectric material 115. The conductive regions 111 and 112 are configured to provide low resistance, conductive paths to the heterojunction region 110. In one embodiment, the first and second semiconductor regions 104 and 105 may be doped with impurities to form the conductive regions 111 and 112. For example, an ion implantation process can provide a concentration of impurities that convert semiconductive regions into conductive regions. In another embodiment, the conductive regions 111 and 112 may be formed from a different material, such as by removing material from areas of the first and second semiconductor materials 104 and 105 to form depressions and depositing metal at the depressions. Further, in some embodiments, the conductive regions 111 and 112 can be positioned differently or conductive regions may be added or omitted depending on the type of semiconductor device to be manufactured.

As shown in FIG. 4, the gate region 113 is aligned with the heterojunction region 110 and can include an individual material or stacked materials of insulative, conductive, or semi-conductive materials. The gate region 113 provides a conductive path for delivering an electric field to the heterojunction region 110. The dielectric material 115 electrically insulates the gate region 113 from the conductive regions 111 and 112. The dielectric material 115 also electrically insulates the carrier 120 (not visible in FIG. 4) from the semiconductor materials. The semiconductor device 100 also includes interconnects 121-123 that extend through the dielectric material 115 and are configured to provide electrical connections to the gate region 113 and the conductive regions 111 and 112. The interconnects 121-123 may be formed, for example, using photolithographic and etching processes to pattern the dielectric material 115. A metallic material, such as tungsten or copper, can be deposited in the patterned portion of the dielectric material 115 to form an ohmic contact. In some embodiments, more or fewer interconnects may be employed depending on the configuration of the semiconductor device 100.

Figure 5:
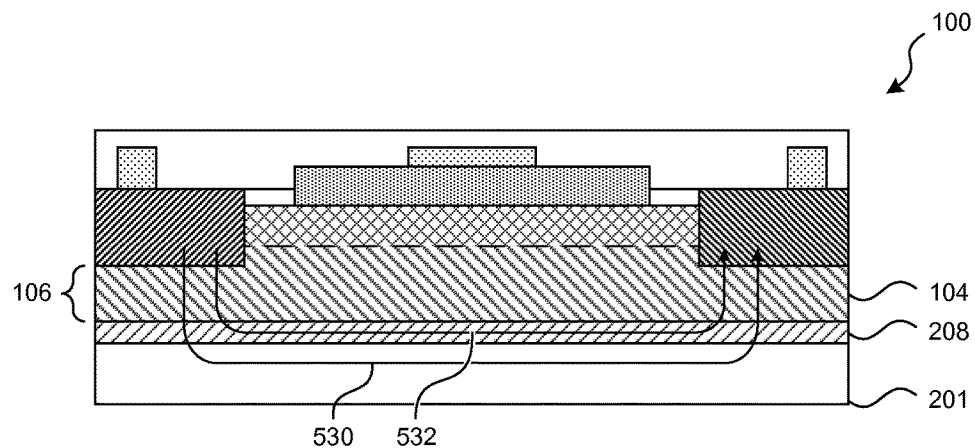

FIG. 5 shows the semiconductor device 100 after removing material from the epitaxial substrate 201 using, for example, backgrinding, etching, planarizing, or other processes for thinning the epitaxial substrate 201. By removing material from the epitaxial substrate 201, parasitic conduction between the conductive regions can be reduced or eliminated. In particular, removing the epitaxial substrate material 201 reduces the size of a parasitic conduction path 530 through the bulk of the epitaxial substrate 201. Complete removal of the epitaxial substrate 201 accordingly eliminates the parasitic conduction path 530 altogether. In some embodiments, the buffer material 208 may also be thinned or removed to reduce or eliminate another potential parasitic conduction path 532 through the buffer material 208. In other embodiments, the bulk region 106 of the first semiconductor material 104 may be thinned to further reduce parasitic conduction.

Figure 6:
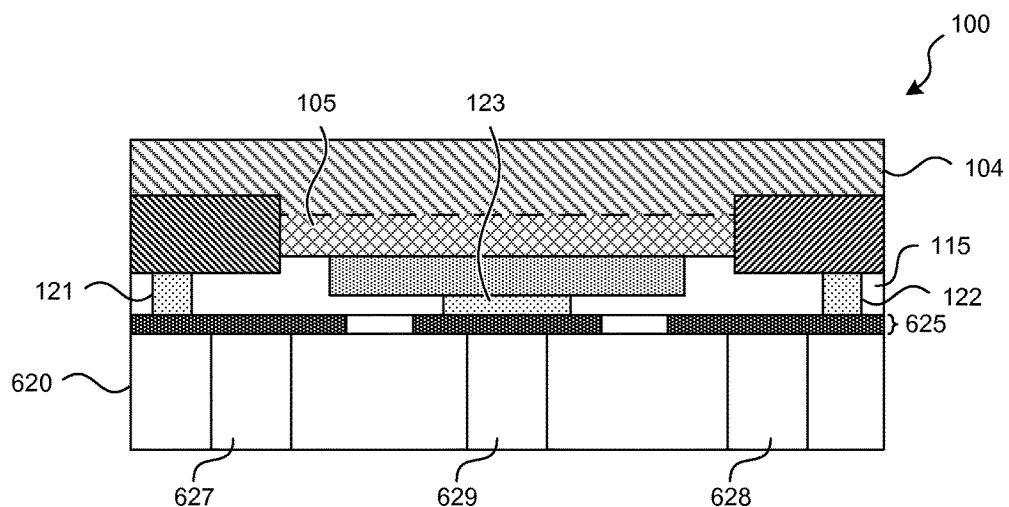

FIG. 6 shows the semiconductor device 100 after coupling the first and second semiconductor materials 104 and 105 to a carrier substrate 620. Embodiments of the carrier substrate 620 can include a semiconductor wafer, die, or other suitable material or substrate. As shown in FIG. 6, the carrier substrate 620 is pre-formed to include features that align with features of the dielectric material 115. For example, the carrier substrate 620 can include through-substrate electrodes 627-629 configured to be aligned with the interconnects 121-123. In the embodiment of FIG. 6, the through-substrate electrodes 627-629 are coupled to the interconnects 121-123 through a patterned metal bond line 625. In one embodiment, the through-substrate electrodes 627-629 are through-substrate silicon vias (TSVs). In other embodiments, the carrier substrate 620 may be aligned with other features, such as metal traces or bond pads.

Embodiments of the carrier substrate 620 can be coupled with the first and second semiconductor materials 104 and 105 in a variety of ways. For example, additional or alternative materials or intermediary materials can intercouple the carrier substrate 620 with the first and second semiconductor materials 104 and 105, such as bond pads, bump bonds, adhesives, epoxies, or other conductive and/or insulative materials. In some embodiments, the carrier substrate 620 is not pre-formed. The through-substrate electrodes 627-629 may be omitted or they may be formed after attaching the carrier substrate 620 to the dielectric material 115. Further, although not illustrated, additional dielectric and metallization structures can be employed to complete a suitable network of electrical connections within the semiconductor device 100 or to other devices located on or off chip.

Also, in some embodiments, a carrier 120 can be coupled to the first and second semiconductor materials 104 and 105 prior to removal of the epitaxial substrate 201 (see FIG. 5). For example, the carrier substrate 620 in FIG. 6 can be coupled to the dielectric material 115 before removing material from the epitaxial substrate 201. In these embodiments, the carrier 120 provides structural support to the semiconductor device 100 during the removal of substrate material and/or material from the buffer material 208 or first semiconductor material 104. The structural support can also support the semiconductor device 100 when transporting the semiconductor device 100 between different manufacturing steps.

Figure 7:
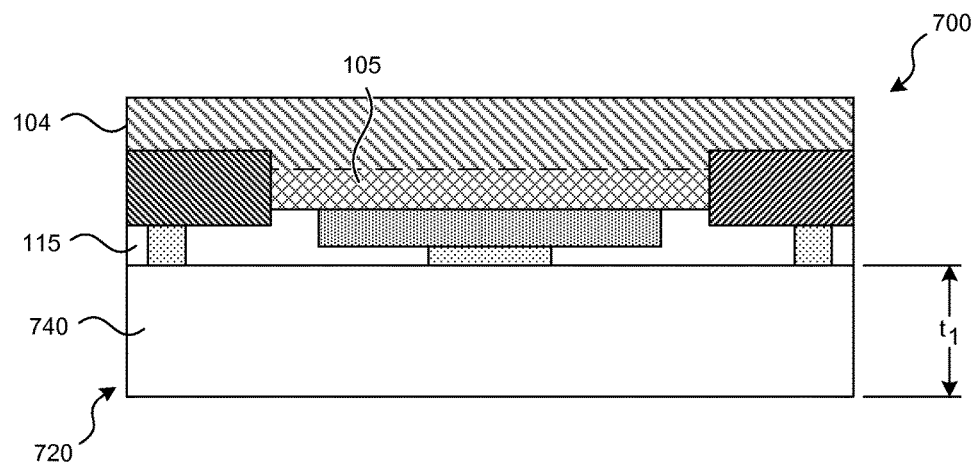
FIGS. 7-8 are partially schematic cross-sectional views illustrating a semiconductor device at selected steps in a method of manufacture in accordance with another embodiment of the present technology.
Figure 8:
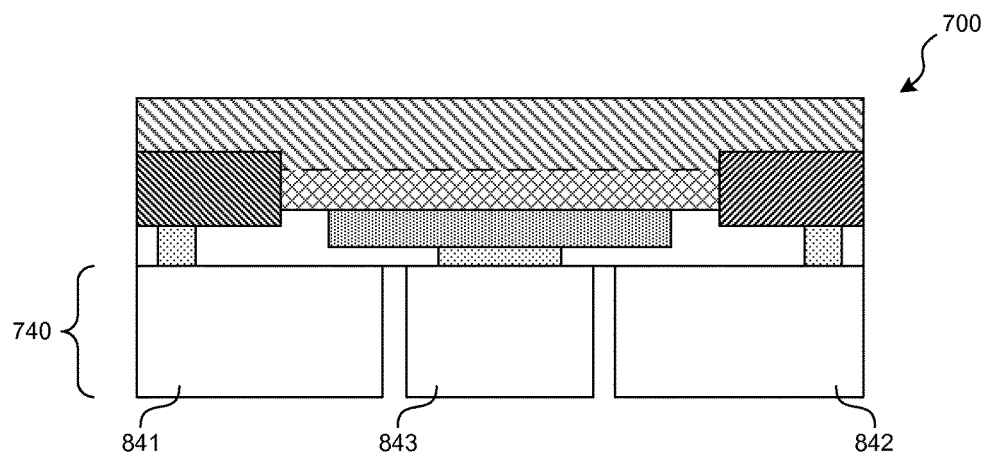

FIGS. 7 and 8 are partially schematic cross-sectional views illustrating a portion of a semiconductor device 700 in accordance with another embodiment of the technology. The semiconductor device 700 is an embodiment of the semiconductor device 100 and is formed in a manner similar to the method of FIGS. 2-6. However, the semiconductor device 700 has a carrier material 720 which is an alternate embodiment of the carrier 120. The carrier material 720 includes a metal material 740 coupled to the first and second semiconductor materials 104 and 105 through the dielectric material 115. Suitable materials for the metal material 740 include plated metal, such as plated copper or coppery alloy. The metal material 740 can have a thickness t1 configured to provide structural support. In one embodiment, the metal material 740 has a thickness of 100 um or greater. In other embodiments, the carrier material 720 includes multiple materials of metal or combinations of materials of different materials.

FIG. 8 shows the semiconductor device 700 after patterning the metal material 740 to form metal contacts 841-843. For example, photolithographic and etching processes can be employed to define the pattern of the metal contacts 841-843 in the metal material 740. In one embodiment, the pattern is defined such that the contact 843 is a gate contact and the contacts 841 and 842 are source and drain contacts of a transistor device.

Figure 9:
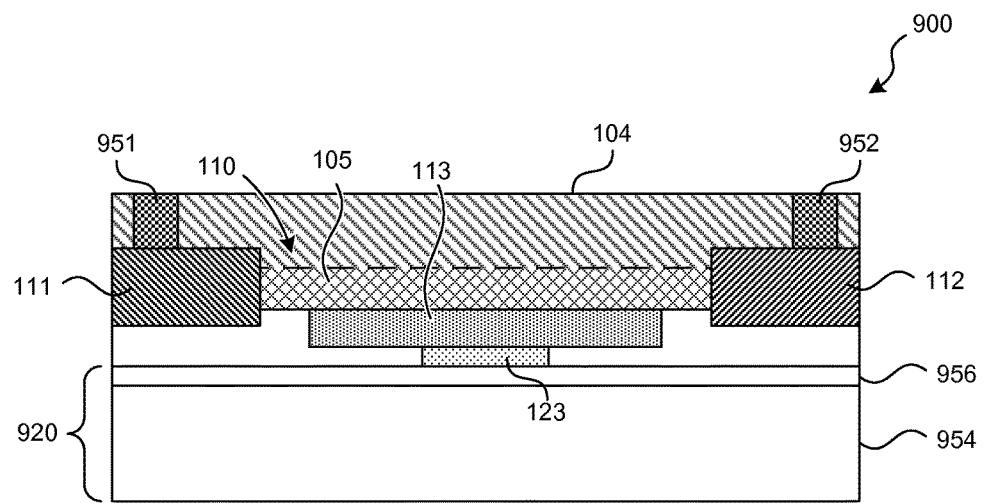
FIGS. 9-11 are partially schematic cross-sectional views illustrating a semiconductor device at selected steps in a method of manufacture in accordance with yet another embodiment of the present technology.
Figure 10:
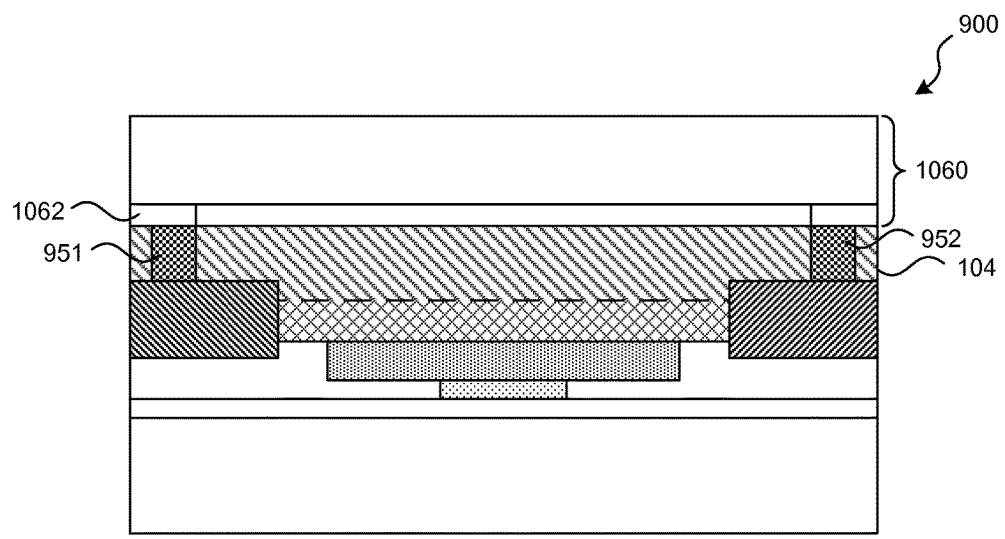
Figure 11:
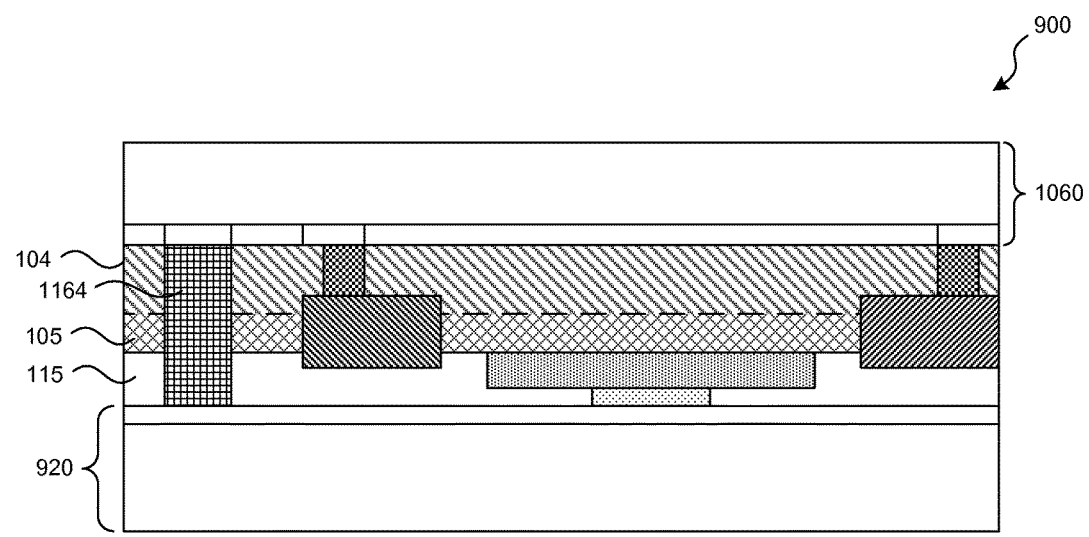

FIGS. 9-11 are partially schematic cross-sectional views illustrating a semiconductor device 900 at selected steps in a method of manufacture in accordance with another embodiment of the technology. The semiconductor device 900 is an embodiment of the semiconductor device 100 and is formed in a manner similar to the method of FIGS. 2-6. However, the semiconductor device 900 includes interconnects 951 and 952 extending through the first semiconductor material 104 and electrically coupled to the conductive regions 111 and 112. The interconnects 951 and 952 may be formed, for example, by etching a pattern in the first semiconductor material 104 (such as through a photoresist or other mask material) and depositing a suitable metal in the patterned portions of the first semiconductor material 104.

As shown in FIG. 9, a carrier 920 includes a substrate 954 and a bond material 956 electrically coupled to the gate region 113 through the interconnect 123. In this configuration the heterojunction region 110 is electrically coupled to an opposite side of the semiconductor device 900. Accordingly, the heterojunction region 110 is electrically coupled at opposite sides of the semiconductor stack 102 of the first and second semiconductor materials 104 and 105. FIG. 10 shows the first semiconductor material 104 of the semiconductor device 900 coupled to another substrate or structure 1060, such as a semiconductor wafer, die, material, or other suitable substrate, material, or stack of material. In one embodiment, the substrate/structure 1060 includes one or more metal bond lines 1062 electrically coupled to the interconnects 951 and 952. In another embodiment, the substrate/structure 1060 is coupled to the interconnects 951 and 952 through a bond wire, bump bond, or other feature (not shown). FIG. 11 shows an embodiment where an electrode 1164 of the semiconductor device 900 extends through the dielectric material 115 and the first and second semiconductor materials 104 and 105. The electrode 1164 in this configuration electrically couples the substrate/structure 1060 to the carrier 920.

Like the semiconductor device 100, embodiments of the semiconductor devices 700 and 900 also inhibit parasitic conduction by removal of the epitaxial substrate used to form the semiconductor devices 700 and 900. In addition, embodiments of the semiconductor devices 700 and 900 can be manufactured with a buffer material (e.g., the buffer material 208) that is subsequently removed or thinned. Also, the bulk region 106 of the first semiconductor material 104 of the stack of semiconductor materials 102 can also be thinned. Further, although not illustrated, additional dielectric and metallization structures can be formed over the contacts 841-843 of the semiconductor device 700 or the interconnects 951 and 952 of the semiconductor device 900 to complete a suitable network of electrical connections within the semiconductor devices 700, 900 or to other devices located on or off chip.

Although illustrated as a transistor device, other embodiments of the semiconductor device 100 can include different configurations, such as a diode, a light emitting diode, or other semiconductor structure employing epitaxial grown materials, heterojunctions, heterostructures, or the like. Also, semiconductor devices 100, 700, 900 can be incorporated alone or with other semiconductor devices into a suitable package (not shown). For example, the semiconductor device 100 can be connected to leads (not shown) of the package using wire bonds (not shown), solder bumps (not shown), or other suitable structures. The semiconductor device 100 and associated structures can also be encapsulated for protection and to facilitate heat dissipation during operation.

Figure 12:
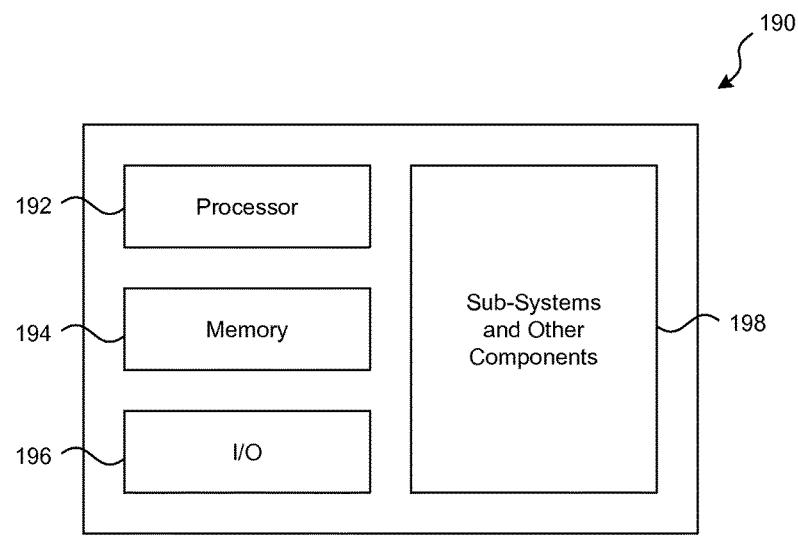
FIG. 12 is a block diagram illustrating a system that incorporates a semiconductor device in accordance with an embodiment of the present technology.

Any one of the semiconductor devices having the features described above with reference to FIGS. 1-11 can be incorporated into any of a myriad of larger and/or more complex systems, a representative example of which is system 190 shown schematically in FIG. 12. The system 190 can include a processor 192, a memory 194 (e.g., SRAM, DRAM, flash, and/or other memory devices), input/output devices 196, and/or other subsystems or components 198. The semiconductor device 100 described above with reference to FIGS. 1-11 can be included in any of the elements shown in FIG. 12. The resulting system 190 can be configured to perform any of a wide variety of suitable computing, processing, storage, sensing, imaging, and/or other functions. Accordingly, representative examples of the system 190 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 190 include lights, cameras, vehicles, etc. With regard to these and other examples, the system 190 can be housed in a single unit or distributed over multiple interconnected units, e.g., through a communication network. The components of the system 190 can accordingly include local and/or remote memory storage devices and any of a wide variety of suitable computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Directional terms, such as "upper," "lower," "front," "back," "vertical," and "horizontal," may be used herein to express and clarify the relationship between various elements. It should be understood that such terms do not denote absolute orientation. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

We claim:

1. A semiconductor device having a first side and a second side opposite the first side, wherein the semiconductor device is formed from an epitaxial substrate, the semiconductor device comprising:

a stack of semiconductor materials comprising a heterojunction region formed from the epitaxial substrate, wherein at least one of the semiconductor materials defines a bulk region adjacent the heterojunction region;

a carrier comprising a substrate at the first side of the semiconductor device, wherein the carrier is configured to carry the stack of semiconductor materials such that the bulk region is between the substrate and the heterojunction region;

conductive regions adjacent the heterojunction region and configured to provide an electrical current through the heterojunction region;

a dielectric material between the heterojunction region and the substrate of the carrier: a first electrode extending through the bulk region and coupled to one of the conductive regions;

a second electrode extending through the bulk region and coupled to another one of the conductive regions;

a third electrode extending through the bulk region, the dielectric material and the heterojunction region; and wherein the epitaxial substrate is removed from the second side of the semiconductor device, and wherein the semiconductor device further comprises a structure at the second side of the semiconductor device from which the epitaxial substrate was removed.

2. The semiconductor device of claim 1, wherein the heterojunction region and the carrier form a portion of a high electron mobility transistor (HEMT) device.

3. The semiconductor device of claim 1, wherein the heterojunction region is a Gallium Nitride (GaN)/Aluminum Gallium Nitride (AlGaN) heterojunction region.

4. The semiconductor device of claim 1, wherein the third electrode contacts the structure at the second side of the semiconductor device.

5. The semiconductor device of claim 1, further comprising a gate region between the heterojunction region and the substrate of the carrier.

6. The semiconductor device of claim 1 wherein the structure at the second side of the semiconductor device includes conductive lines coupled to corresponding ones of the conductive regions.

7. A semiconductor device having a first side and a second side opposite the first side, the semiconductor device comprising:

a carrier comprising a first substrate at the first side of the semiconductor device;

a heterojunction region and a bulk material from which the heterojunction region is formed while the bulk region is attached to a common substrate that is subsequently removed from the second side of the semiconductor device, wherein the heterojunction region is between the first substrate and the bulk material;

a second substrate at the second side of the semiconductor device where the common substrate was removed;

conductive regions adjacent the heterojunction region and configured to provide an electrical current through the heterojunction region;

a dielectric material between the heterojunction region and the first substrate;

a first interconnect extending through the bulk material and coupled to one of the conductive regions;

a second interconnect extending through the bulk material and coupled to another one of the conductive regions; and a third interconnect extending through the bulk material, the heterojunction region, and the dielectric material.

8. The semiconductor device of claim 7, further comprising conductive lines formed between the second substrate and the base material, wherein the conductive lines are electrically coupled to corresponding ones of the conductive regions via the first and second and second interconnects.

9. The semiconductor device of claim 7 wherein the semiconductor device further comprises a metallization structure at the second side of the semiconductor device, wherein the third interconnect is coupled to the metallization structure.

10. The semiconductor device of claim 7 wherein the semiconductor device further comprises a gate region coupled between the heterojunction region and the first substrate, wherein the third interconnect is coupled to the gate region.

11. The semiconductor device of claim 7, further comprising a source contact coupled to the first interconnect, a drain contact coupled to the second interconnect, and a gate contact coupled to the third interconnect.

12. The semiconductor device of claim 7 wherein the heterojunction and the carrier form a gate region of a high electron mobility transistor (HEMT) device.

13. The semiconductor device of claim 7 wherein the heterojunction region comprises Gallium Nitride (GaN) and Aluminum Gallium Nitride (AlGaN) adjacent the GaN.

14. A semiconductor device, comprising:

a carrier;

a bulk material and a heterojunction formed from the bulk material, wherein the heterojunction is between the carrier and the bulk material;

a substrate over the bulk material, wherein the bulk material is between the substrate and the heterojunction;

conductive regions adjacent the heterojunction and configured to provide an electrical current through the heterojunction;

a dielectric material between the heterojunction and the carrier;

a first interconnect and a second interconnect each extending through the bulk material and coupled to a corresponding one of the conductive regions; and a third interconnect extending through the bulk material, the heterojunction, and the dielectric material.

15. The semiconductor device of claim 14 wherein the carrier comprises a metal substrate and a bond material bonding the metal substrate to the dielectric material.

16. The semiconductor device of claim 14 further comprising a gate region adjacent the heterojunction and the dielectric material.

17. The semiconductor device of claim 16, further comprising a fourth interconnect coupled to the heterojunction, wherein the fourth interconnect is between the heterojunction and the carrier, and wherein the carrier electrically couples the third and further interconnects.

* * * * *